United States Patent
Chu et al.

(10) Patent No.: US 6,446,647 B1
(45) Date of Patent: Sep. 10, 2002

(54) CASSETTE HOLDER FOR CLEANING EQUIPMENT

(75) Inventors: Eric Chu, Hsin-Chu; Hung-Hsien Chang, Hsin-Chu Hsien; To-Yao Hsu, Miao-Li; Chin-Wen Chung, Hsin-Chu Hsien; Hsing-Sheng Yang, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 165 days.

(21) Appl. No.: 09/597,744

(22) Filed: Jun. 19, 2000

(51) Int. Cl.[7] ................................................. B08B 3/00
(52) U.S. Cl. ..................... 134/113; 134/201; 134/902
(58) Field of Search ........................ 134/59, 94.1, 105, 134/113, 137, 201, 902

(56) References Cited

U.S. PATENT DOCUMENTS

| 3,521,413 A | * | 7/1970 | Scott et al. ................... 248/158 |
| 5,547,515 A | * | 8/1996 | Kudo et al. ..................... 134/21 |
| 6,116,254 A | * | 9/2000 | Shiramizu ................. 134/100.1 |

FOREIGN PATENT DOCUMENTS

| JP | 01012534 A | * | 1/1989 |
| JP | 03209822 A | * | 9/1991 |
| JP | 03256326 A | * | 11/1991 |
| JP | 05129268 A | * | 5/1993 |

* cited by examiner

Primary Examiner—Randy Gulakowski
Assistant Examiner—Joseph Perrin
(74) Attorney, Agent, or Firm—Winston Hsu

(57) ABSTRACT

A cassette holder is positioned within cleaning equipment. The cleaning equipment includes a solution tank, at least one pipe positioned on an internal wall of the solution tank, and a cassette in which at least one semiconductor wafer is placed. The cassette holder has a loading plate in the solution tank for holding the cassette. Pluralities of guide blocks mounted on the loading plate prevent movement of the cassette. A side-frame is positioned at an end of the loading plate proximate to the pipe. The bottom of the loading plate has a plurality of neck feet, and each neck foot is covered by a first tube that enhances support strength of the neck foot. The cassette holder further includes at least one weight to overcome buoyancy.

9 Claims, 4 Drawing Sheets

CASSETTE HOLDER FOR CLEANING EQUIPMENT

BACKGROUND OF THE INVENTION

1. Field of the Invention

The present invention relates to a cassette holder, and more particularly, to a cassette holder for cleaning equipment.

2. Description of the Prior Art

In current semiconductor processes, automatic cleaning equipment is some of the most fundamental and common fabrication equipment. The automatic cleaning equipment uses a robot to move a cassette carrying semiconductor wafers between acid tanks and water tanks, automating surface cleaning of the semiconductor wafers. To prevent the robot from losing the cassette, a loading plate is usually placed at the bottom of the acid or water tank. The loading plate prevents the cassette from moving, and thus prevents it from being misplaced and hence irretrievable to the robotic arm.

Please refer to FIG. 1. FIG. 1 is a schematic diagram of automatic semiconductor cleaning equipment 10 according to the prior art. The cleaning equipment 10 comprises a robot (not shown), a solution tank 12, a plurality of pipes 14 positioned on an internal wall of the solution tank 12, a cassette 16 in which a plurality of semiconductor wafers are placed, and a cassette holder 20 in the solution tank 12. The cassette holder 20 can hold two cassettes 16. The pipes 14 usually comprise a thermal couple thermometer 22, a barometric level sensor 24, a heater 26, a supply pipe 28 and an aspirator 30. The cleaning equipment 10 is usually equipped with three or four heaters 26, though FIG. 1 shows only one heater 26.

The cassette holder 20 comprises a loading plate 32, a plurality of guide blocks 34 mounted on the loading plate 32, and a plurality of feet 36 supporting the loading plate 32. The cassette holder 20 uses guide blocks 34, two in each direction, to prevent any displacement of the cassette 16.

In semiconductor processes, a hot-acid solution is usually used as an etching or cleaning solution. The solution tank 12, therefore, is made of quartz, which is resistant to both heat and acid. Similarly, the loading plate 32 is formed by welding quartz rods together (usually called a quartz frame). Such a frame is resistant to the hot-acid solution. The cassette holder 20 is quite light, and may be uplifted by the underlying heater 26, or by buoyancy. In overcome buoyancy of the cassette holder 20, the loading plate 32 is often made of large-diameter quartz rods to increase its weight and improve its structural integrity. However, in the event of errors or accidents the thicker quartz rods may cause the solution tank 12 crack. For example, the robot may fail to remove the cassette 16 from the solution tank 12, and another cassette is then put into the solution tank 12 on top of the cassette 16. Overloading of cassettes can cause serious damage to the cassette holder 20, such as breaking the loading plate 32.

Furthermore, although a Teflon holding plate 38 is employed to fix each of the pipes 14 to the top of the wall of the solution tank 12, the bottoms of the pipes 14 that extend into the solution tank 12 are not sufficiently restricted. After the pipes 14 have been exposed to the hot-acid solution for a period of time, the bottoms of the pipes 14 may distort and push against the cassette 16, leading to misplacement of the cassette 16. This, in turn, can lead to accidents during the automatic transfer process.

In order to prevent the acid solution from evaporating, a hood (not shown) covers the solution tank 12. This hinders the operator from observing the solution level in the solution tank 12. The operator can check the solution level only when the hood is opened, but the operator must check the level quickly as the hood closes in a short while after the cassette 16 is placed into the solution tank 12. The solution tank 12 does employ the barometric level sensor 24 to check the level of the acid solution in the solution tank 12. The barometric level sensor 24 is full of nitrogen gas. Different solution levels cause different gas pressures within the barometric level sensor 24. A level panel (not shown) uses a set of six variable resistors to generate the level signal.

In practice, however, there is no steady reference point for the solution level. Most operators adjust the solution level based upon experience. Thus, the solution level isn't controlled precisely and scientifically. If the solution level is too high, the acid solution is wasted and may flow over the solution tank 12. If solution level is too low, the upper portion of the wafer 18 may lack sufficient chemical treatment, causing defects to the wafer 18.

SUMMARY OF THE INVENTION

It is therefore a primary objective of the present invention to provide a cassette holder for cleaning equipment to solve the above-mentioned problem.

In a preferred embodiment, the present invention provides a cassette holder positioned in cleaning equipment. The cleaning equipment comprises a solution tank, at least one pipe positioned on an internal wall of the solution tank, and at least one cassette in which at least one semiconductor wafer is placed. The cassette holder has a loading plate in the solution tank for holding the cassette. There are pluralities of guide blocks mounted on the loading plate to prevent movement of the cassette, and a side-frame positioned at an end of the loading plate proximate to the pipe. The side-frame is designed for disassembly and serves as a shield between the pipe and the cassette that prevents the pipe from pushing against the cassette. The side-frame comprises a horizontal rod that serves as a level index for the solution tank. The bottom of the loading plate has a plurality of neck feet, and once a neck foot suffers a force that exceeds a normal value, the neck foot will break. A Teflon tube that enhances the support strength of the neck foot covers each neck foot. The cassette holder further comprises at least one weight to overcome buoyancy of the cassette holder.

It is an advantage of the present invention that the cassette holder has the side-frame that prevents the pipe from pushing against the cassette. The side-frame includes the horizontal rod that serves as a level index for the solution. The bottom of the loading plate has a plurality of neck feet, which prevents the loading plate from impacting the solution tank during accidents in the transfer process. The cassette holder uses the weight to overcome buoyancy of the cassette holder.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
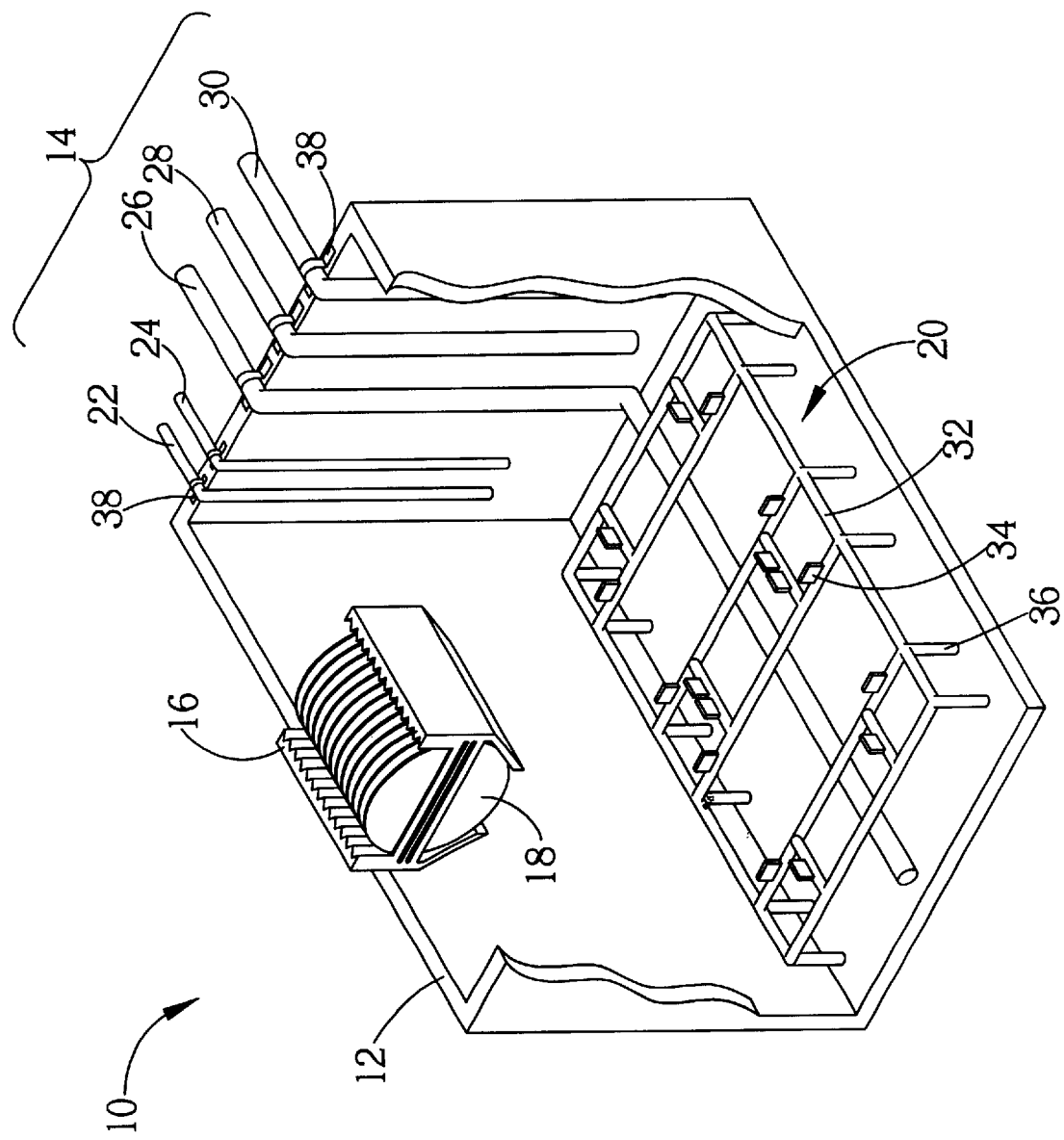
FIG. 1 is a schematic diagram of automatic semiconductor cleaning equipment according to the prior art.
Figure 2:
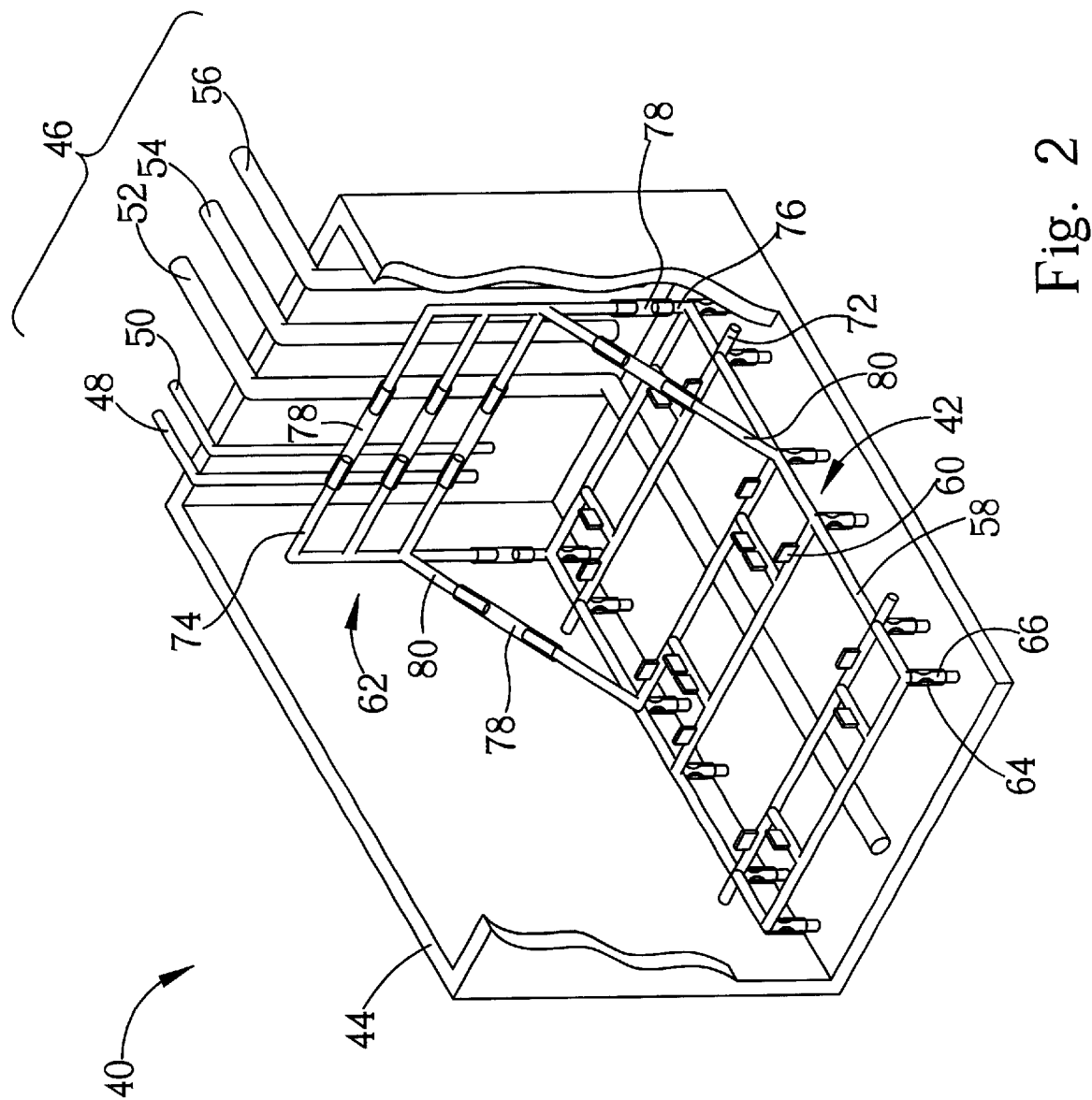
FIG. 2 is a schematic diagram of a cassette holder of the present invention in automatic cleaning equipment.

Please refer to FIG. 2. FIG. 2 is a schematic diagram of a cassette holder 42 of the present invention in automatic cleaning equipment 40. The automatic cleaning equipment 40 comprises a solution tank 44, a plurality of pipes 46 positioned on an internal wall of the solution tank 44, and a cassette (not shown) in which aplurality of semiconductor wafers (not shown) are placed.

The pipes 46 can have different functions, and be various in number. In this invention, the pipes 46 include a thermal couple thermometer 48, a barometric level sensor 50, a heater 52, a supply pipe 54 and an aspirator 56. The automatic cleaning equipment 40 is usually equipped with three or four heaters 52, though FIG. 2 shows only one heater 52.

The cassette holder 42 rests on a loading plate 58. A plurality of guide blocks 60 and a side-frame 62 are mounted on the loading plate 58. A plurality of neck feet 64 are also mounted on the bottom of the loading plate 58, and each of the neck feet 64 is covered by a Teflon tube 66. The loading plate 58 is placed in the solution tank 44 for holding the cassette, while the guide blocks 60 are used to prevent movement of the cassette. In order to protect against high temperatures and corrosive chemical solutions, both the loading plate 58 and the side-frame 62 are made of a material that is resistant to both heat and acid, such as quartz or glass.

Figure 3:
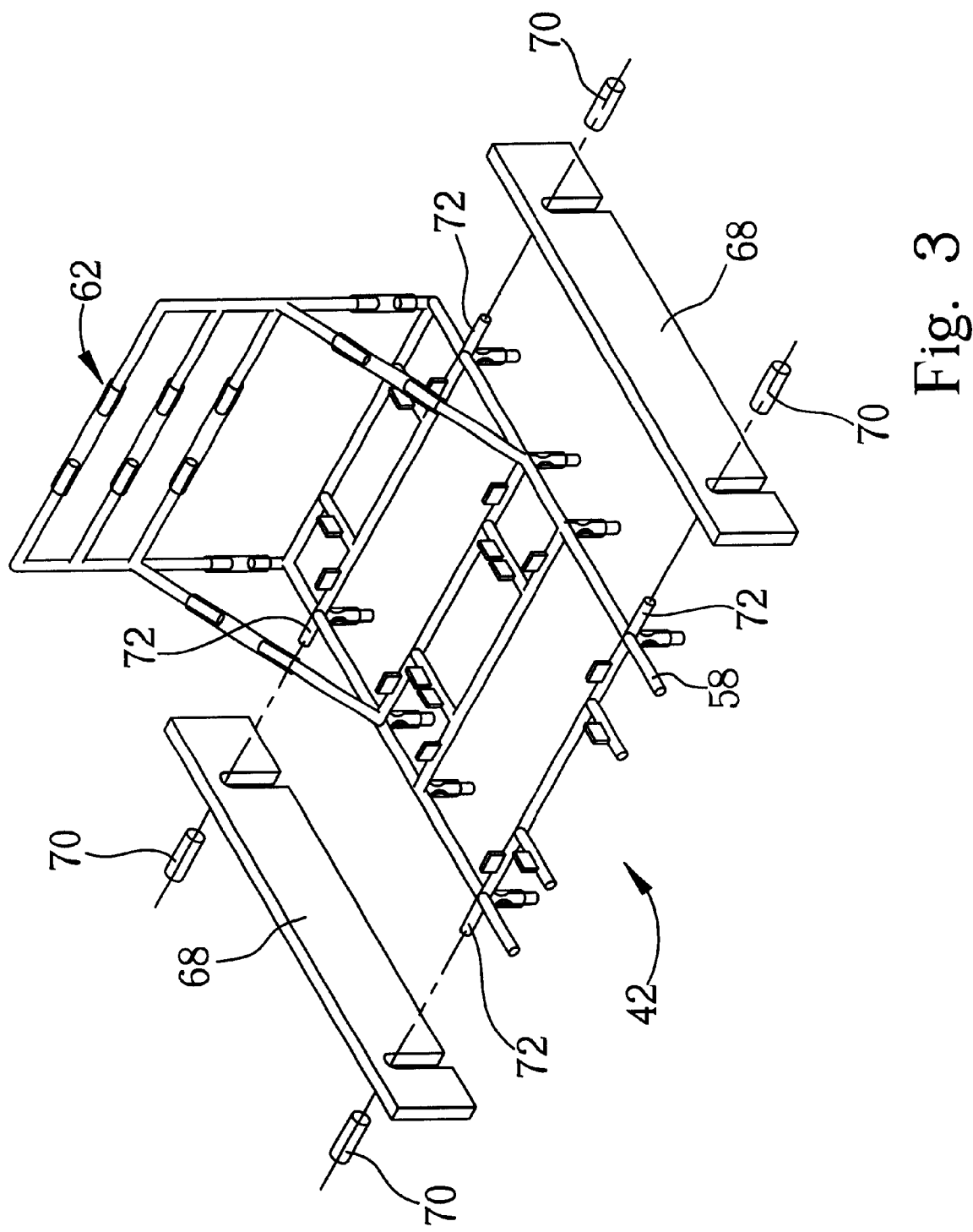
FIG. 3 is a schematic diagram of the loading plate and a weight of the cassette holder according to the present invention.

Please refer to FIG. 3. FIG. 3 is a schematic diagram of the loading plate 58 and a weight 68 of the cassette holder 42 according to the present invention. To prevent the cassette holder 42 from being lifted by the heater 52 or from buoyancy, the cassette holder 42 is equipped with a weight 68 on both sides of the loading plate 58 for increasing the total weight of the cassette holder 42. As shown in FIG. 3, the weights 68 are affixed onto four overhanging rods 72 of the loading plate 58 using four Teflon tubes 70. The material of the weights 68 should be heavy and resistant to both hot and acidic solutions. In this invention, the weights 68 are made of quartz.

The side-frame 62 is positioned at an end of the loading plate 58 proximate to the pipes 46. The side-frame 62 serves as a shield between the pipes 46 and the cassette. If the pipes 46 become distorted due to high temperatures or corrosive materials, the side-frame 62 will prevent the distorted pipes 46 from pushing against the cassette. Thus, the pipes 46 will not affect the position of the cassette on the loading plate 58.

Figure 4:
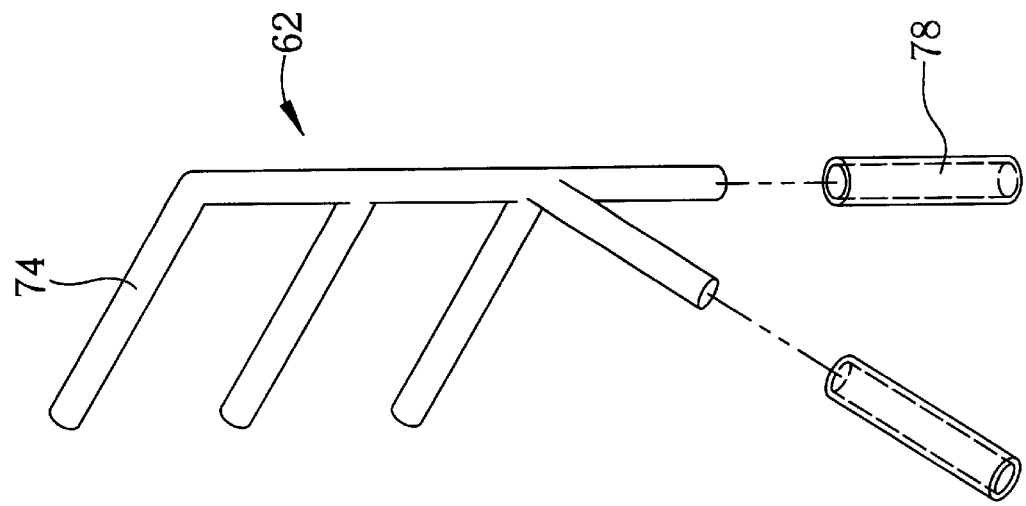
FIG. 4 is a detailed sectional view of a side-frame in FIG. 2.

Please refer to FIG. 4. FIG. 4 is a detailed sectional view of the side-frame 62 in FIG. 2. The side-frame 62 has a horizontal rod 74, which serves as a standard level index for the solution tank 44. The horizontal rod 74 acts as the horizontal target line for solution level adjustments, and is used together with the level signal from the barometric level sensor 50 to obtain a consistent quality of level adjustments. The operator can determine if the solution level is high enough to cover the entire wafer by seeing the relative positions of the solution level and the horizontal rod 74 before the cassette is placed into the solution tank 44.

In the present invention, the side-frame 62 is mounted on the loading plate 58 in a manner that permits easy disassembly. Two pillars 76 are positioned at the end of the loading plate 58 proximate to the pipes 46. A Teflon tube 78 covers each pillar 76. The side-frame 62 is mounted onto the Teflon tubes 78. Two symmetrical pieces combine to form the side-frame 62, and the Teflon tubes 78 are used to join the horizontal rods 74 together. Thus, the side-frame 62 can be easily disassembled on the loading plate 58, while the Teflon tubes 62 make the side-frame 78 more elastic. The side-frame 62 can be directly welded onto the loading plate 58, and two horizontal rods 78 can be welded together to form a permanent structure without using the Teflon tubes 78.

In order to enhance the horizontal supporting strength of the side-frame 62, two additional forked rods 80 can be mounted on the loading plate 58. The forked rods 80 are mounted between the loading plate 58 and the side-frame 62, propping the side-frame at a slanted angle. In the present invention, the side-frame 62 is designed for easy disassembly, and so the forked rod 80 has an upper part and a lower part, which are joined together by the Teflon tubes 78.

Figure 5:
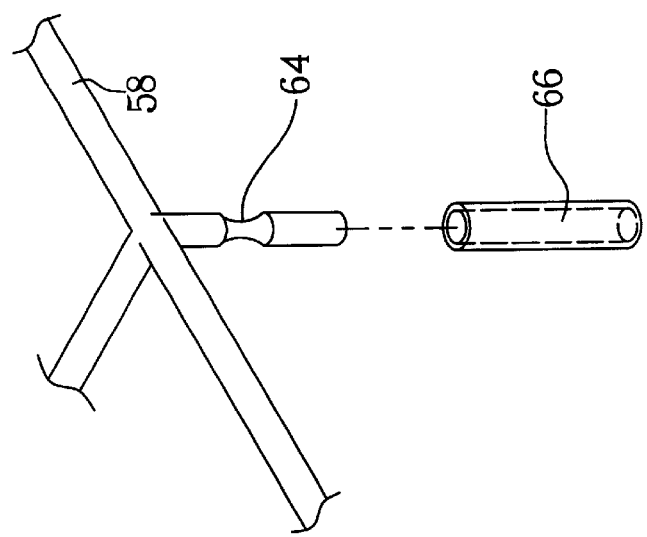
FIG. 5 is a detailed view of a neck foot in FIG. 2.

Please refer to FIG. 5. FIG. 5 is a detailed view of the neck foot 64 in FIG. 2. As shown in FIG. 5, the cassette holder 42 has the neck feet 64 on the bottom of the loading plate 58. Once a neck foot 64 suffers a force that exceeds a normal value, the neck foot 64 will break. Each neck foot 64 is covered by the Teflon tube 66 that enhances the support strength of the neck foot 64. If, due to robotic malfunction, a cassette impacts the cassette holder 42, the neck feet 64 will break and absorb the force of the impact. The neck feet 64 not only reduce the number of defects on the semiconductor wafers, but they also prevent cracking of the solution tank 44 and consequent leakage of hot-acid solution in the event of cassette overloading.

It is an advantage of the cassette holder 42 according to the present invention that the cassette holder 42 has an easily disassembled side-frame 62 that serves as a shield against the pipes 46, thus ensuring that the cassette is well-protected. The horizontal rod 74 of the side-frame 62 serves as a solution level index, and works together with the level signal from the barometric level sensor 50 to help guarantee a consistent quality to the solution level. Furthermore, the bottom of the loading plate 42 has the neck feet 64 that are covered by the Teflon tubes 66. If an accident happens to the cassette that causes a subsequent impact to the cassette holder 42, the neck feet 64 will break so as to reduce the number of defects to the semiconductor wafers and to prevent cracking of the solution tank 44.

In contrast to the prior art cassette holder 20, the cassette holder 42 according to the present invention uses the side-frame 62 to prevent any distorted pipes 46 from pushing against the cassette, and thus maintains precise positioning of the cassette. Additionally, the horizontal rod 74 of the side-frame 62 serves as a marker for solution level adjustments, helping the operator to control the level of the solution. The neck feet 64 of the cassette holder 42 absorb the shock of accidental impacts, and thus reduce not only the number of defects on the semiconductor wafers, but also prevent damage to the solution tank 44.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A cassette holder positioned in cleaning equipment, the cleaning equipment comprising a solution tank and at least one cassette in which at least one semiconductor wafer is placed, the cassette holder comprising;

a loading plate in the solution tank for holding the cassette:

a plurality of guide blocks mounted on the loading plate to prevent movement of the cassette; and a plurality of neck feet mounted on the bottom of the loading plate, and a mid-portion of each neck foot having a smaller cross-sectional area than both of a top-portion and a bottom-portion of each neck foot;

wherein each neck foot is covered by a first tube that enhances support strength of the neck foot.

2. The cassette holder of claim 1 wherein the cassette holder further comprises at least one weight to overcome buoyancy of the cassette holder.

3. The cassette holder of claim 1 wherein the cleaning equipment further comprises at least one pipe positioned on an internal wall of the solution tank, and the cassette holder further comprises a side-frame positioned at an end of the loading plate proximate to the pipe, the side-frame serving as a shield between the pipe and the cassette that prevents the pipe from pushing against the cassette.

4. The cassette holder of claim 3 wherein the side-frame mounted on the loading plate is designed for disassembly.

5. The cassette holder of claim 4 wherein the cassette holder further comprises two pillars positioned at the end of the loading plate, each pillar covered by a second tube, and the side-frame is mounted onto the second tubes so that the side-frame can be disassembled.

6. The cassette holder of claim 3 wherein the cassette holder further comprises two forked rods mounted on the loading plate, the forked rods propping the side-frame at a slanted angle for enhancing the horizontal support strength of the side-frame.

7. The cassette holder of claim 3 wherein the loading plate and the side-frame are both made of a material that is resistant to both heat and acid.

8. The cassette holder of claim 7 wherein the material is quartz or glass.

9. The cassette holder of claim 3 wherein the side-frame further comprises a horizontal rod that serves as a level index for the solution tank.

\* \* \* \* \*